United States Patent [19]
West et al.

[11] Patent Number: 4,849,702
[45] Date of Patent: Jul. 18, 1989

[54] TEST PERIOD GENERATOR FOR AUTOMATIC TEST EQUIPMENT

[75] Inventors: Burnell G. West, Fremont; Richard F. Herlein, San Jose, both of Calif.

[73] Assignee: Schlumberger Techologies, Inc., San Jose, Calif.

[21] Appl. No.: 282,830

[22] Filed: Dec. 8, 1988

Related U.S. Application Data

[63] Continuation of Ser. No. 933,298, Nov. 19, 1986, abandoned, which is a continuation of Ser. No. 611,267, May 17, 1984, abandoned, which is a continuation of Ser. No. 518,499, Aug. 1, 1983, abandoned.

[51] Int. Cl.⁴ .................. H03K 1/17; G01R 15/12; G01R 31/28
[52] U.S. Cl. .................... 328/63; 307/269; 328/72; 328/55; 371/20; 371/27; 324/73 R
[58] Field of Search ............... 307/269; 371/20, 21, 371/25, 27; 328/63, 60, 72, 55; 324/73 R, 73 A X; 364/571, 579, 580, 481, 486

[56] References Cited

U.S. PATENT DOCUMENTS

| | | | |
|---|---|---|---|
| Re. 31,056 | 10/1982 | Chau et al. | 371/1 |
| 4,055,801 | 10/1977 | Pike et al. | 324/73 R |
| 4,168,527 | 9/1979 | Winkler | 364/580 |
| 4,293,950 | 10/1981 | Shimizu et al. | 324/73 R |
| 4,450,560 | 5/1984 | Conner | 324/73 R |
| 4,488,297 | 12/1984 | Vaid | 371/1 |
| 4,495,468 | 1/1985 | Richards et al. | 328/63 |
| 4,519,090 | 5/1985 | Stackhouse et al. | 377/19 |

OTHER PUBLICATIONS

M. Catalano et al., 1983, *IEEE International Test Conference*, (Oct. 18–20), CH1933-1/83, Paper 8.3, pp. 188–192.

R. F. Herlein et al., 1983, *IEEE International Test Conference*, (Oct. 18–20), CH1933-1/83, Paper 8.5, pp. 200–209.

S. Sugamori et al., 1981, *IEEE International Test Conference*, (Oct. 27–29), CH1693-1/81, Paper 7.5, pp. 143–153.

*Primary Examiner*—Stanley D. Miller
*Assistant Examiner*—Timothy P. Callahan
*Attorney, Agent, or Firm*—David H. Carroll; Robert C. Colwell; Paul C. Haughey

[57] ABSTRACT

A timing subsystem 10 including several test period generators for supplying a variety of timing signals to a device under test. Major, minor, and free-run period generators each supply various timing signals to a multiplexer 18, which selectively connects the timing signals to timing generators 20. A central processing unit 28 supplies data to the period generators and timing generators to define their respective timing signals. Timing signals generated by the major period generator 12 define the overall testing rate. The minor period generator 14 generates multiple timing signals within the periods of the major clock signals to permit higher clock rates. Timing signals that are independent of the major clock periods are generated by the free-run period generator 16. An external synchronizer circuit 26 provides a feedback loop from the device under test 22 to the major period generator. A reference driver trigger delay circuit 27 provides means for calibrating the timing generators. Each of the three period generators includes two interconnected timing interval generators 30 and 40 that alternately generate overlapping timing signals. Each timing interval generator includes a stop-restart oscillator 32, a counter 34, and a delay-line vernier 36. Upon the receipt of a start signal, the oscillator stops and restarts to align its clock pulses to the start signal. The oscillator output clocks the counter, which supplies a signal to the vernier when a preselected number is reached. The vernier delays the counter signal by a preselected delay and issues a signal that designates the end of the period.

26 Claims, 7 Drawing Sheets

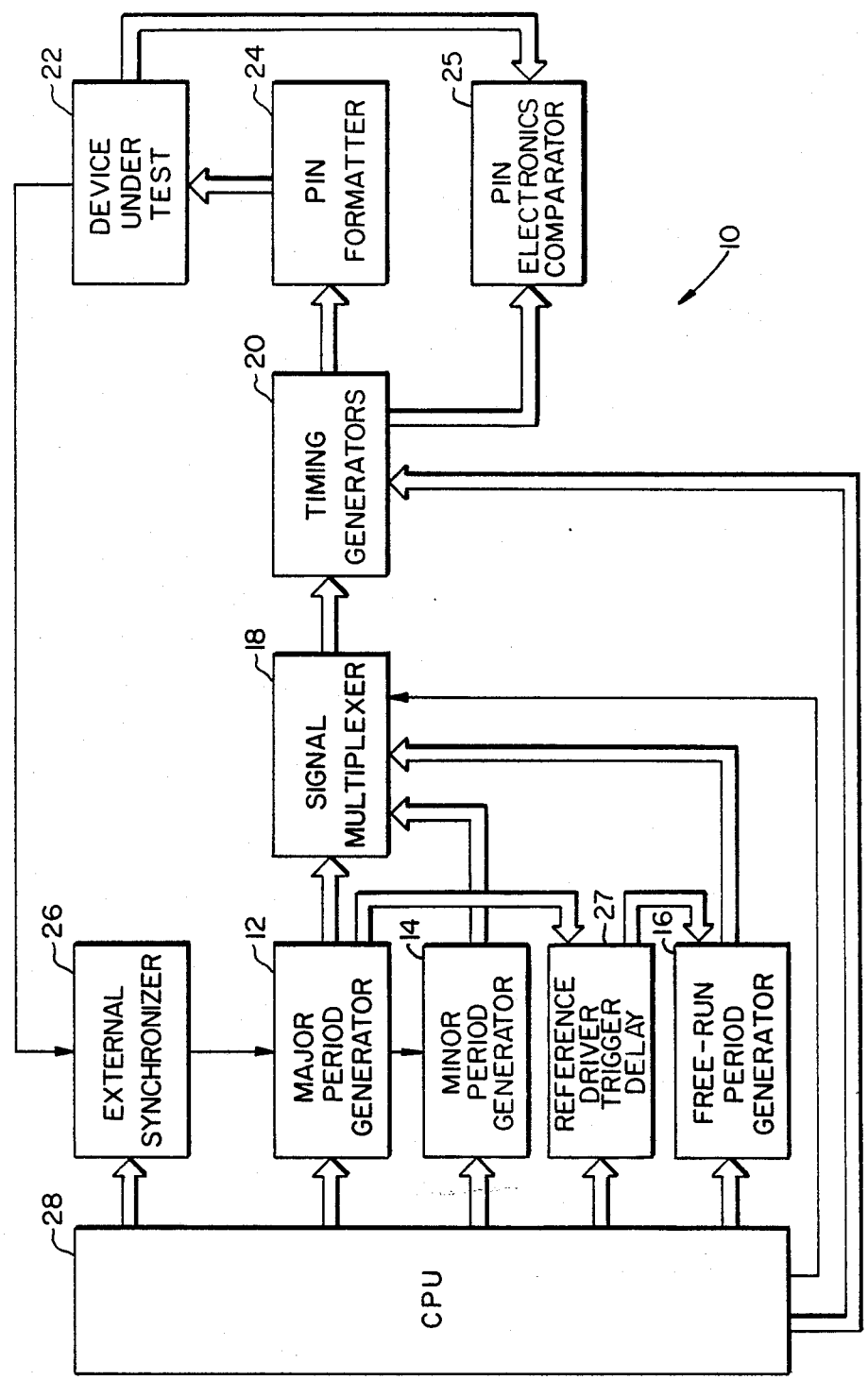
FIG._1.

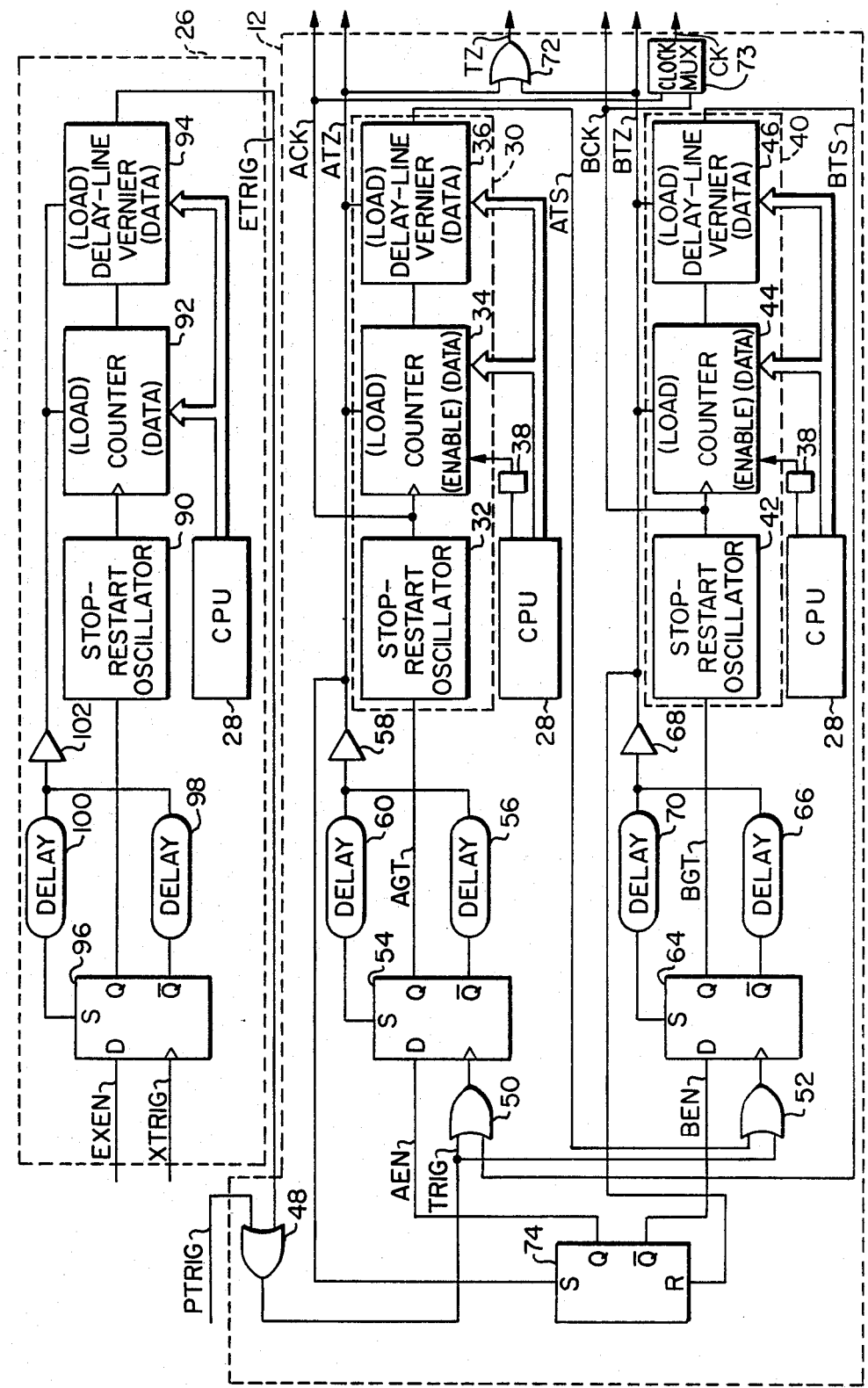
FIG._2.

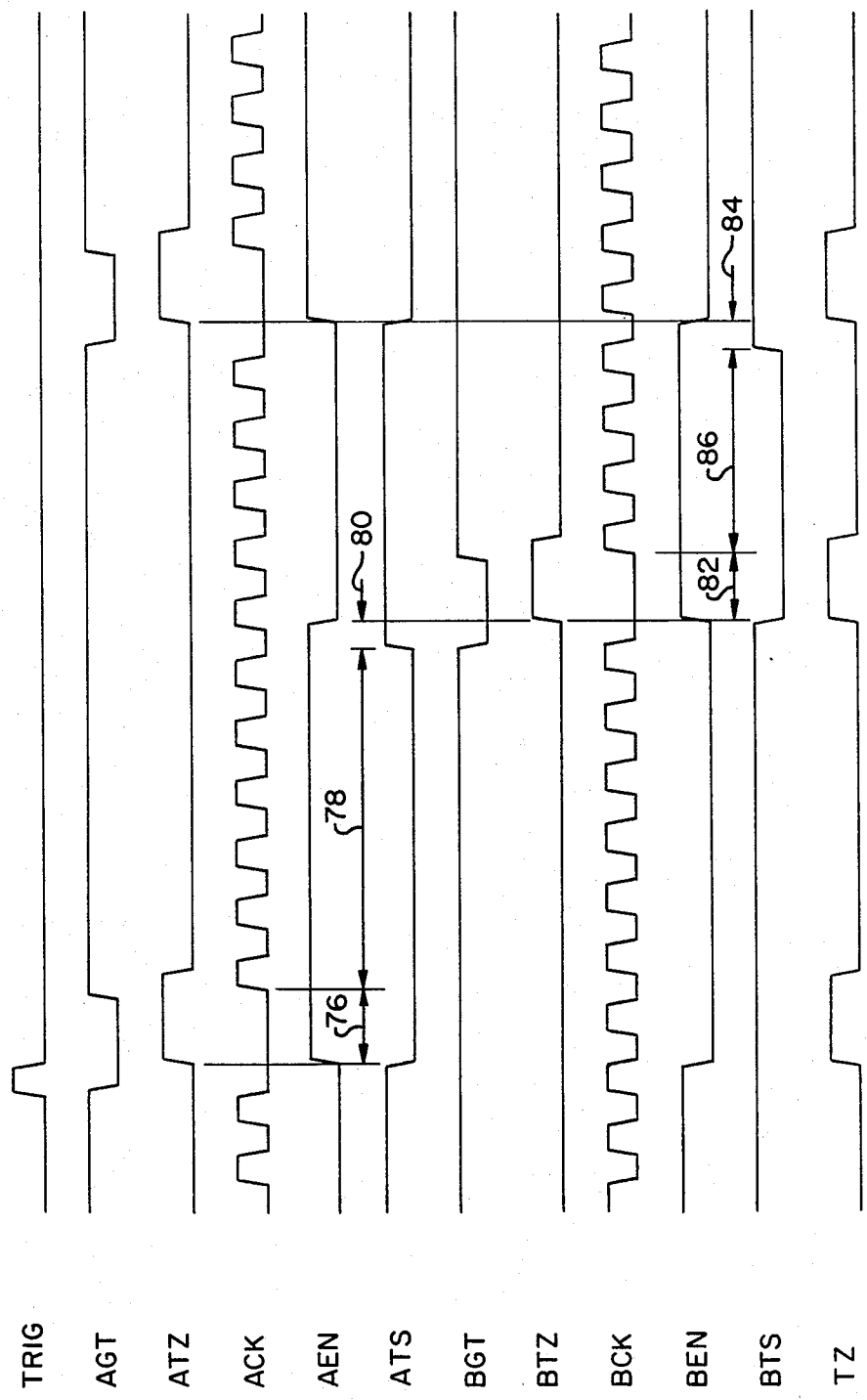
FIG._3.

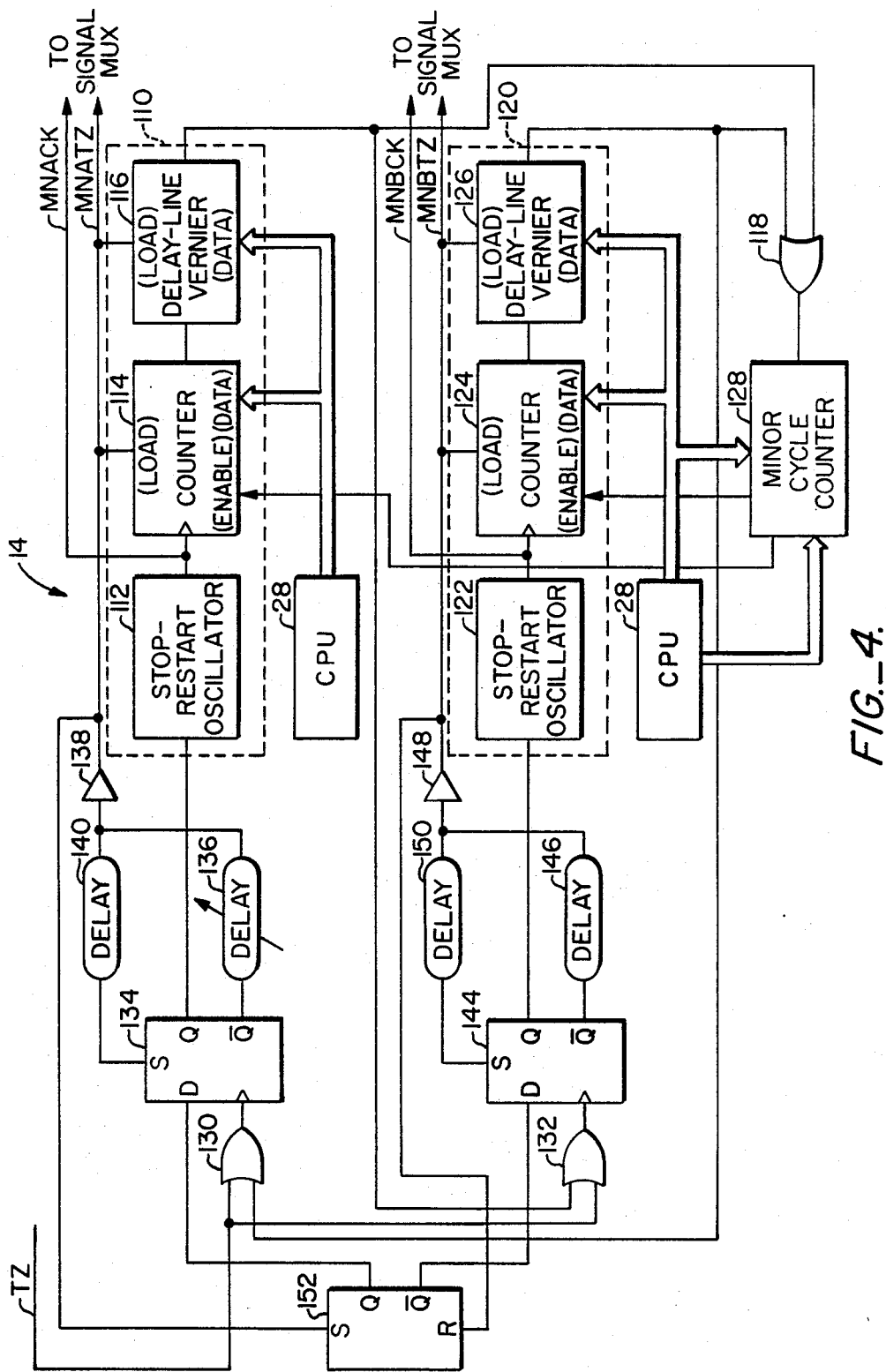
FIG._4.

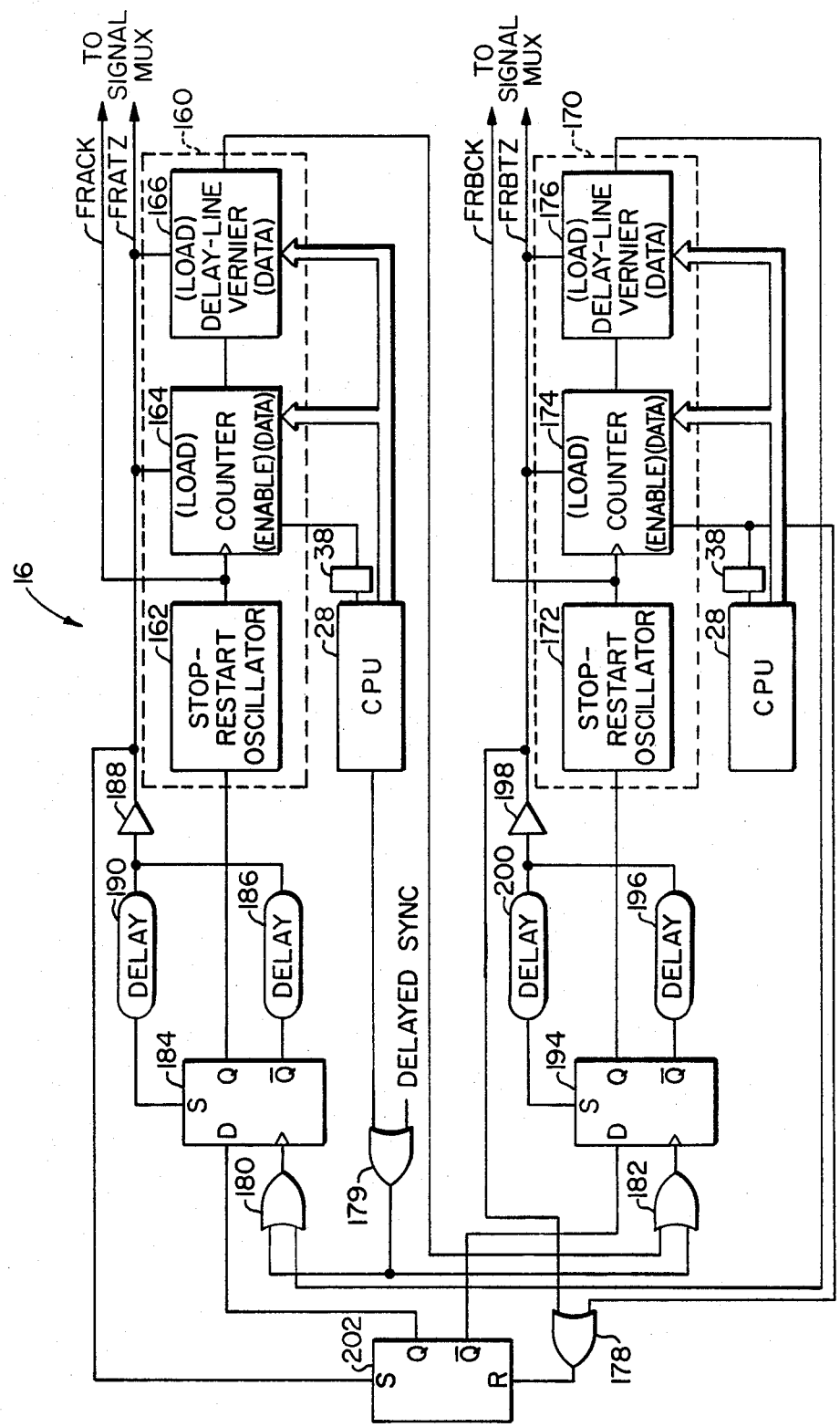
FIG._5.

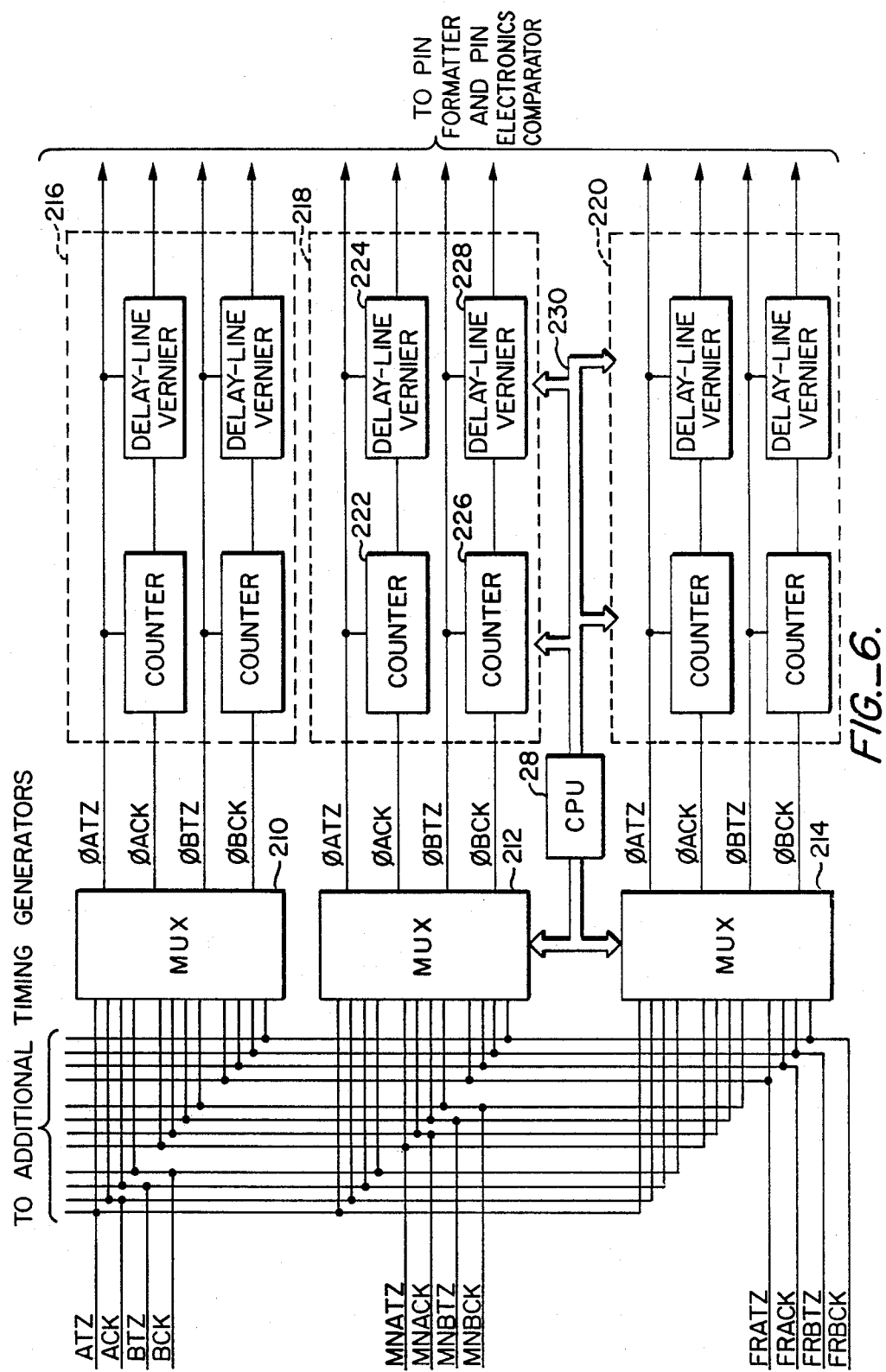
FIG._6.

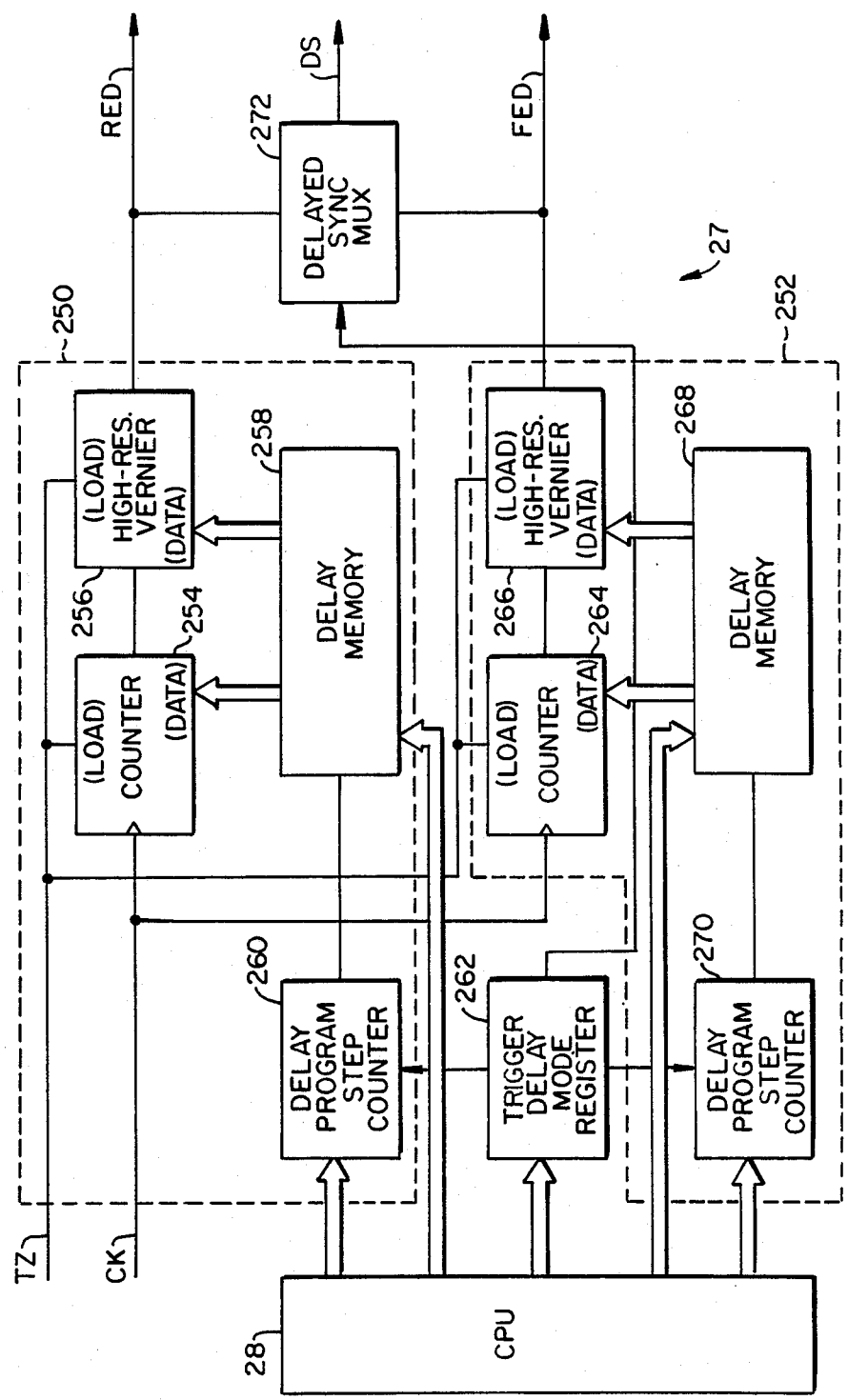
FIG._7.

TEST PERIOD GENERATOR FOR AUTOMATIC TEST EQUIPMENT

REFERENCE TO RELATED APPLICATION

This is a continuation of Ser. No. 933,298 filed Nov. 19, 1986, now abandoned, which is a continuation of Ser. No. 611,267 filed May 17, 1984, now abandoned, which is a continuation-in-part of U.S. Pat. Application Ser. No. 518,499, filed Aug. 1, 1983 and entitled "High Speed Test System" now abandoned.

BACKGROUND OF THE INVENTION

1. Field of the Invention

This invention relates generally to electronic circuits used in automatic test equipment, and relates more particularly to a timing subsystem that includes several test period generators capable of supplying a variety of timing signals to a device under test.

2. Description of the Prior Art

In automatic test equipment used for testing electronic circuits, test patterns of electronic signals are generated and applied to selected input pins of a device under test. The condition of the output pins of the device under test is then detected and compared to a desired condition to determine the functionality or quality of the circuit. The circuitry within the automatic test equipment which establishes the timing of the test patterns is known as a timing subsystem. The timing subsystem must accurately supply timing signals to the device under test, and must be flexible enough to accommodate the timing requirements of a wide range of devices.

Prior art timing subsystems have commonly utilized constant frequency crystal oscillators to generate timing signals. The flexibility of such timing subsystems is limited since the frequencies of the timing signals are defined in terms of fixed multiples and submultiples of the fundamental oscillator frequency.

Test patterns generally include several timing signals, each having a different frequency. Commonly, major clock signals are generated to establish an overall testing rate, and minor clock signals are generated to establish higher frequency timing signals. Prior art timing subsystems using crystal oscillators have provided minor clock signals by using hardware that subdivided the major clock signals and, thus, limited the flexibility of defining the minor clock signals.

Testing requirements sometimes dictate that the timing subsystem be synchronized to the operation of the device under test so that test patterns generated by the testing system are triggered by a signal from the device under test. Prior art timing subsystems using non-resettable crystal oscillators have been inherently inaccurate in synchronizing to external events. It has been customary in such prior art automatic test equipment to pause up to one clock period after the receipt of an external synchronization signal to accommodate signal jitter. This causes a timing uncertainty on the order of one clock period.

Certain devices under test require external clock signals as timing inputs. Prior art timing subsystems typically could not easily provide an external clock signal, so standard practice has been to supply a separate crystal oscillator. This practice, however, increases the cost of testing and restricts flexibility in the operation of the automatic test equipment.

What is needed is an accurate, flexible, and capable timing subsystem for use in automatic test equipment.

SUMMARY OF THE INVENTION

In accordance with the illustrated preferred embodiment, the present invention provides a timing subsystem that includes several test period generators for supplying timing signals to a device under test. The timing subsystem of the present invention includes a major period generator, a minor period generator, a free-run period generator, an external synchronizer circuit, a reference driver trigger delay circuit, a signal multiplexer, and several timing generators. The major, minor, and free-run period generators each supply various timing signals to the multiplexer, which selectively connects the timing signals to the timing generators. A central processing unit supplied data to the period generators and timing generators to define their respective timing signals, and also controls signal selection by the multiplexer. The timing signals that are supplied by the major period generator are major clock signals that define the overall testing rate. The minor period generator supplies multiple minor clock signals within the periods of the major clock signals to permit higher clock rates than are dictated by the major clock signals. Timing signals that are independent of the major clock signals are generated by the free-run period generator. The external synchronizer circuit provides a feedback loop from the device under test to the major period generator to permit the device under test to trigger certain timing signals. The timing generators are slave units that are triggered by the period generators, and include forcing timing generators and comparing timing generators. The forcing timing generators generate timing signals for the device under test, while the comparing timing generators supply timing signals to a pin electronics comparator. The reference driver trigger delay circuit is used in conjunction with the major and free-run period generators to provide means for calibrating the forcing and comparing timing generators.

Each of the three period generators includes two interconnected timing interval generators that alternately generate timing signals. By providing two timing interval generators for generating each timing signal, adjacent clock periods can overlap, thereby permitting flexibility in the definition of the timing signals.

Each timing interval generator is capable of defining time intervals according to data supplied by the central processing unit. Each timing interval generator includes a stop-restart oscillator, a counter, and a delay-line vernier. Upon the receipt of a start signal, the oscillator stops and restarts to align its clock signal to the start signal. The start signal also loads the data from the central processing unit into the timing interval generator, namely a preselected number into the counter and a preselected delay into the vernier. The oscillator clock signal clocks the counter, which supplies a signal to the vernier after the preselected number of pulses have been counted. The vernier delays this signal by the preselected delay and issues another signal that designates the end of the time interval. By selection of the preselected number and delay, the duration of the time interval is specified.

The reference driver trigger delay circuit provides means for calibrating the forcing and comparing timing generators. The major period generator is used to initiate two timing signals, one generated by a forcing timing generator, and the other generated by a comparing timing generator. The forcing timing generator is triggered directly by the major period generator, while the comparing timing generator is triggered indirectly after delays through the reference driver trigger delay circuit and the free-run period generator. The delay through the reference driver trigger delay circuit is adjustable, and can be programmed to change with each successive timing cycle.

BRIEF DESCRIPTION OF THE DRAWINGS

FIG. 1 is a block diagram of a timing subsystem with three test period generators according to the preferred embodiment of the present invention.

FIG. 2 is a schematic diagram of a major period generator and an external synchronizer circuit that are utilized in the timing subsystem of FIG. 1.

FIG. 3 is a timing diagram of timing signals generated by the major period generator of FIG. 2.

FIG. 4 is a schematic diagram of a minor period generator that is utilized in the timing subsystem of FIG. 1.

FIG. 5 is a schematic diagram of a free-run period generator that is utilized in the timing subsystem of FIG. 1.

FIG. 6 is a schematic diagram of a signal multiplexer and several timing generators that are utilized in the timing subsystem of FIG. 1.

FIG. 7 is a schematic diagram of a reference driver trigger delay circuit that is utilized in the timing subsystem of FIG. 1.

DETAILED DESCRIPTION OF THE PREFERRED EMBODIMENT

The preferred embodiment of the present invention is a timing subsystem that includes three separate period generators for supplying timing signals to a device under test. As shown in FIG. 1, the three period generators of timing subsystem 10 are a major period generator 12, a minor period generator 14, and a free-run period generator 16. The major period generator generates timing signals, known as major clock signals, that define the overall testing rate. Minor period generator 14 generates minor clock signals at higher clock rates than the major clock signals. Timing signals that are independent of the major clock signals are generated by the free-run period generator. The timing signals generated by the three period generators are routed through a signal multiplexer 18 to several timing generators 20. The timing generators include both forcing timing generators and comparing timing generators. The forcing timing generators supply timing signals to a device under test 22 through a pin formatter 24, while the comparing timing generators supply timing signals to a pin electronics comparator 25. The pin electronics comparator receives output signals from the device under test and compares them to the timing signals from the comparing timing generators. A feedback loop from the device under test to the major period generator is provided by an external synchronizer circuit 26, which permits timing signals to be triggered by the device under test. A reference driver trigger delay circuit 27 is coupled to the major period generator and the free-run period generator, and provides means for calibrating the timing generators. A central processing unit 28 provides control and data management functions for the timing subsystem.

Each of the three period generators 12, 14, and 16 includes two interconnected timing interval generators. Upon the receipt of a start signal, a first timing interval generator issues a first time zero signal and a first clock signal that is aligned with respect to the first time zero signal. After a first predetermined time interval has elapsed, the first timing interval generator issues a first transfer signal that causes a second timing interval generator to issue a second time zero signal that is aligned with respect to the first transfer signals, and a second clock signal that is aligned to the second time zero signal. After a second predetermined time interval has elapsed, the second timing interval generator issues a second transfer signal that causes the first timing interval generator to issue another first time zero signal and another first clock signal. Test periods defined by the time zero signals are adjustable in duration and can overlap. The two interconnected timing interval generators of each period generator thus define alternate test periods of selectable duration and overlap.

While the circuitry and operation of the three period generators 12, 14, and 16 are quite similar in many respects, each period generator serves a unique function within timing subsystem 10. Accordingly, each of the period generators will be described separately. The major period generator 12 and the external synchronizer circuit 26 will be described in reference to FIGS. 2 and 3. The minor period generator 14 will be described in reference to FIG. 4, and the free-run period generator 16 will be described in reference to FIG. 5. Signal multiplexer 18 and timing generators 20 will be described in reference to FIG. 6. The reference driver trigger delay circuit 27 will be described in reference to FIG. 7.

The circuitry of the major period generator 12 is illustrated in FIG. 2. A first timing interval generator 30 includes a stop-restart oscillator 32, a counter 34, and a delay-line vernier 36. Oscillator 32 generates a first clock signal, ACK, which is connected to the clock input terminal of counter 34 and is also connected to the signal multiplexer 18 for routing to the timing generators 20. Vernier 36 has an input terminal connected to an output terminal of counter 34, and generates a first transfer signal ATS. The central processing unit 28 is coupled to an input terminal of a sync mode register 38 and to data input terminals of both counter 34 and vernier 36. An output terminal of sync mode register 38 is connected to an enable input terminal of counter 34. The delay-line verniers of the present invention are preferably formed of multiplexers connected to progressive taps of delay line circuits. The selection of various delays is accomplished by the multiplexers.

Similarly, a second timing interval generator 40 includes a stop-restart oscillator 42, a counter 44, and a delay-line vernier 46. Oscillator 42 generates a second clock signal, BCK, which is connected to the clock input terminal of counter 44 and is also connected to the signal multiplexer 18 for routing to the timing generators 20. Vernier 46 has an input terminal connected to an output terminal of counter 44, and generates a second transfer signal BTS. The central processing unit 28 is coupled to data input terminals of both counter 44 and vernier 46. An output terminal of sync mode register 38 is connected to an enable input terminal of counter 44. The components of the first and second timing interval generators are matched so that both timing interval generators operate in substantially the same fashion.

The remainder of the circuitry of the major period generator 12 provides triggering means for receiving triggering signals from the central processing unit 28 and the external synchronizer circuit 26 and for alternately triggering the first and second timing interval generators 30 and 40. Either the central processing unit generates signal PTRIG, or the external synchronizer circuit generates signal ETRIG to initiate a testing sequence. An OR gate 48 receives PTRIG and ETRIG as input signals, and supplies signal TRIG to input terminals of OR gates 50 and 52. OR gate 50 also receives transfer signal BTS from vernier 46 as an input signal. The output terminal of OR gate 50 is connected to the clock input terminal of a D-type flip-flop 54. The non-inverting (Q) output terminal of flip-flop 54 generates signal AGT, which is coupled to oscillator 32 for stopping and restarting clock signal ACK. The inverting output terminal of flip-flop 54 is connected to one end of delay line 56. The other end of delay line 56 is connected to the input terminal of a buffer 58 and to one end of another delay line 60. The other end of delay line 60 is connected to the set input terminal of flip-flop 54. Buffer 58 generates a first time zero signal, ATZ, which designates the beginning of each first phase test period defined by the first timing interval generator 30. Signal ATZ is coupled to load input terminals of counter 34 and vernier 36 for initiating the loading of data from the central processing unit. Signal ATZ is also connected to the signal multiplexer 18 for routing to the timing generators 20.

The second timing interval generator 40 is triggered through OR gate 52. OR gate 52 receives transfer signal ATS from vernier 36 and signal TRIG from OR gate 48 as its two input signals. The output terminal of OR gate 52 is connected to the clock input terminal of a D-type flip-flop 64. The non-inverting (Q) output terminal of flip-flop 64 generates signal BGT, which is coupled to oscillator 42 for stopping and restarting clock signal BCK. The inverting output terminal of flip-flop 64 is connected to one end of a delay line 66. The other end of delay line 66 is connected to the input terminal of a buffer 68 and to one end of another delay line 70. The other end of delay line 70 is connected to the set input terminal of flip-flop 64. Buffer 68 generates a second time zero signal, BTZ, which designates the beginning of each second phase test period defined by the second timing interval generator 40. Signal BTZ is coupled to load input terminals of counter 44 and vernier 46 for initiating the loading of data from the central processing unit. Signal BTZ is also connected to the signal multiplexer 18 for routing to the timing generators 20. Signals ATZ and BTZ are also supplied to input terminals of a OR gate 72, which generates signal TZ as a composite time zero signal. Signals ACK and BCK are supplied to input terminals of a clock multiplexer 73, which generates signal CK. Signal CK is equal to either signal ACK or signal BCK, depending upon which portion of the major period generator is in operation.

A flip-flop 74 enables either the first or the second timing interval generator to define the initial test period and to thereafter alternate between the two timing interval generators. Flip-flop 74 generates signal AEN at its non-inverting (Q) output terminal and supplies AEN to the D input terminal of flip-flop 54. The first timing interval generator 30 is enabled to receive a triggering input signal when signal AEN is logic low. Flip-flop 74 generates signal BEN at its inverting output terminal and supplies BEN to the D input terminal of flip-flop 64. The second timing interval generator 40 is enabled to receive a triggering input signal when signal BEN is logic low. Signal ATZ is coupled to the set input terminal of flip-flop 74, while signal BTZ is coupled to the reset input terminal of flip-flop 74.

FIG. 3 illustrates the interrelationships among the various signals during the operation of the major period generator in internal sync mode. When the timing subsystem operates in internal sync mode, the sync mode register 38 enables counters 34 and 44. In FIG. 3, time increases from left to right. Signal TRIG is at a logic low state until a positive pulse initiates the initial test period. The positive-going edge of TRIG passes through OR gate 50 and into the clock terminal of flip-flop 54. Assuming the signal AEN is logic low (enabling the first timing interval generator), the positive-going edge of TRIG causes signal AGT to go to the logic low state. A logic low state for signal AGT stops the clock pulses of the first clock signal ACK. The positive-going pulse from the inverting input of flip-flop 54 is delayed by delay line 56, and then emerges from buffer 58 as a positive edge in signal ATZ. The positive edge of signal ATZ loads data into counter 34 and vernier 36, resets transfer signal ATS to logic low, and activates the set input terminal of flip-flop 74. Flip-flop 74 responds by setting signal AEN to logic high and signal BEN to logic low. The positive edge of signal ATZ also causes a positive edge in signal TZ.

The positive edge of ATZ designates the beginning of the initial test period. The positive edge from delay line 56 is further delayed by delay line 60, and then activates the set input terminal of flip-flop 54. When this happens, signal AGT returns to logic high, causing the oscillator 32 to restart. Since the delays through delay lines 56 and 60 and flip-flop 54 are constant, clock signal ACK is precisely aligned with respect to the time zero signal, ATZ. The known delay from the positive edge of ATZ to the restarting of ACK is shown as time interval 76 in FIG. 3. Signal ATZ returns to the logic low state after the negative edge from the inverting output terminal of flip-flop 54 propagates through delay line 56 and buffer 58. Signal ATZ remains at the logic low state and signal ACK continues to generate clock pulses until the beginning of the next first phase test period.

After a predetermined time interval has passed subsequent to the beginning of the first phase test period, a second phase test period is begun. The duration of this predetermined time interval is determined by the data loaded into counter 34 and vernier 36 from the central processing unit. When the first clock signal ACK restarts, counter 34 starts counting clock pulses. After a preselected number of clock pulses have been counted, counter 34 supplies a signal to the delay-line vernier 36. Vernier 36 delays this signal by an amount equal to a preselected delay, and then switches the first transfer signal, ATS, to logic high. The positive edge of signal ATS propagates through OR gate 52 and into the clock terminal of flip-flop 64. Flip-flop 64 switches signal BGT to the logic low state, which in turn causes the second clock signal, BCK, to stop. The second time zero signal, BTZ, goes positive a short time later, after propagating through delay line 66 and buffer 68. The positive edge of BTZ designates the beginning of the second phase test period. The positive edge of signal BTZ loads data into counter 44 and vernier 46, resets transfer signal BTS to logic low, and activates the reset input terminal of flip-flop 74. Flip-flop responds by setting signal AEN to logic low and signal BEN to logic high. The positive edge of signal BTZ also causes a positive edge in signal TZ.

The positive edge of BTZ designates the beginning of the second phase test period. The positive edge of the signal emerging from delay line 66 is further delayed by delay line 70, and then activates the set input terminal of flip-flop 64. When this happens, signal BGT returns to logic high, causing the oscillator 42 to restart. Since the delays through delay lines 66 and 70 and flip-flop 64 are constant, clock signal BCK is precisely aligned with respect to the time zero signal, BTZ. The known delay from the positive edge of BTZ to the restarting of BCK is shown as time interval 82 and FIG. 3. Signal BTZ returns to the logic low state after the negative edge from the inverting output terminal of flip-flop 64 propagates through delay line 66 and buffer 68. Signal BTZ remains at the logic low state and signal BCK continues to generate clock pulses until the beginning of the next second phase test period.

After another predetermined time interval has passed subsequent to the beginning of the second phase test period, the initial first phase test period is ended and another first phase test period is begun. The duration of this time interval is determined by the data that was loaded into counter 44 and vernier 46 from the central processing unit. When the second clock signal BCK restarts, counter 44 starts counting clock pulses. After a preselected number of pulses have been counted, counter 44 supplies a signal to the delay-line vernier 46. Vernier 46 delays this signal by an amount equal to a preselected delay, and then switches the second transfer signal, BTS, to logic high. The positive edge of signal BtS propagates through OR gate 50 and into the clock terminal of flip-flop 54. Flip-flop 54 switches signal AGT to the logic low state, which in turn causes the first clock signal, ACK, to stop. The first time zero signal, ATZ, goes positive a short time later, after propagating through delay line 56 and buffer 58. The positive edge of ATZ designates the end of the initial first phase test period and the beginning of the next first phase test period. The positive edge of signal ATZ loads new data into counter 34 and vernier 36, resets transfer signal ATS to logic low, and activates the set input terminal of flip-flop 74. The positive edge of signal ATZ also causes a positive edge in signal TZ.

The time interval between the positive edge of signal ATZ and the positive edge of signal BTZ is the sum of two fixed delays and one selectable delay. As described above, time interval 76 from the positive edge of signal ATZ to the restarting of clock signal ACK is fixed by the delays through delay line 60 and flip-flop 54. Time interval 78 spans the time period from the restarting of clock signal ACK until the generation of the positive edge of transfer signal ATS. Time interval 78 is equal to the preselected number loaded into counter 34 multiplied by the clock period of signal ACK, and added to the preselected delay loaded into vernier 36. Thus, time interval 78 is a selectable delay and is determined by the data supplied to counter 34 and vernier 36 by the central processing unit. A second fixed delay, time interval 80, is determined by propagation delays through OR gate 52, flip-flop 64, delay line 66, and buffer 68. The sum of time intervals 76, 78, and 80 equals the time interval between the positive edge of signal ATZ and the positive edge of signal BTZ.

Similarly, the time interval between the positive edge of signal BTZ and the next positive edge of signal ATZ is also the sum of two fixed delays and one selectable delay. Time interval 82 is a fixed delay through delay line 70 and flip-flop 64, while time interval 84 is a fixed delay through OR gate 50, flip-flop 54, delay line 56 and buffer 58. Time interval 86 is a selectable delay, and is determined by data supplied by the central processing unit to counter 44 and vernier 46. The sum of time intervals 76, 78, 80, 82, 84, and 86 equals the duration of the first phase test period as defined by the time interval between positive edges of signal ATZ. The duration of each of the first and second phase test periods is thus determined by two selectable delays plus fixed delays. In addition, the relative timing between each of the first and second phase test periods is determined by one selectable delay plus fixed delays.

Returning now to FIG. 2, the external synchronizer circuit 26 and its connection to the major period generator are shown. The external synchronizer circuit includes another timing interval generator that comprises a stop-restart oscillator 90, a counter 92, and a delay-line vernier 94. Oscillator 90 generates a first clock signal which is connected to the clock input terminal of counter 92. Vernier 94 has an input terminal connected to an output terminal of counter 92, and generates the trigger signal ETRIG. The central processing unit 28 is coupled to data input terminals of both counter 92 and vernier 94.

The external synchronizer circuit also includes a triggering circuit that comprises a D-type flip-flop 96, two delay lines 98 and 100, and a buffer 102. The non-inverting output terminal of flip-flop 96 is connected to an input terminal of oscillator 90 for stopping and restarting the oscillator. One end of delay line 98 is connected to the inverting output terminal of flip-flop 96, and the other end is connected to the input terminal of buffer 102 and to one end of delay line 100. The other end of delay line 100 is connected to the set input terminal of flip-flop 96. Two signals are input to flip-flop 96; EXEN is an enable signal and is applied to the D input terminal, and XTRIG is a trigger signal from the device under test and is applied to the clock terminal.

The external synchronizer circuit 26 provides a feedback loop from the device under test to the major period generator 12 when the timing subsystem operates in external sync mode. The external synchronizer circuit operates as does each half of the major period generator described above, and generates ETRIG after a selected time delay subsequent to the receipt of signal XTRIG. The external synchronizer circuit is enabled by a logic low state of signal EXEN. Upon the receipt of a positive edge of signal XTRIG, the non-inverting output of flip-flop 96 stops the oscillator. After propagating through delay line 98 and buffer 102, the counter is loaded with a preselected number and the vernier is loaded with a preselected delay. After an additional delay through delay line 100, the oscillator restarts. After the counter counts up to the preselected number and the vernier delays by the preselected delay, ETRIG is generated. ETRIG triggers the generation of one time zero signal and the alignment of its corresponding clock signal. In external sync mode, the sync mode register 38 disables counters 34 and 44, thus preventing the generation of a transfer signal to trigger the operation of the other timing interval generator.

The circuitry of the minor period generator 14 is illustrated in FIG. 4, and is quite similar to that of the major period generator 12. A first timing interval generator 110 includes a stop-restart oscillator 112, a counter 114, and a delay-line vernier 116. Oscillator 112 generates a minor first clock signal, MNACK, which is connected to the clock input terminal of counter 114 and is also connected to the signal multiplexer 18 for routing to the timing generators 20. Vernier 116 has an input terminal connected to an output terminal of counter 114. The central processing unit 28 is coupled to data input terminals of both counter 114 and vernier 116.

Similarly, a second timing interval generator 120 includes a stop-restart oscillator 122, a counter 124, and a delay-line vernier 126. Oscillator 122 generates a minor second clock signal, MNBCK, which is connected to the clock input terminal of counter 124 and is also connected to the signal multiplexer 18 for routing to the timing generators 20. Vernier 126 has an input terminal connected to an output terminal of counter 124. The central processing unit 28 is coupled to data input terminals of both counter 124 and vernier 126. The components of the first and second timing interval generators 110 and 120 are matched so that both timing interval generators operate in substantially the same fashion. The output terminals of both verniers 116 and 126 are connected to input terminals of an OR gate 118. A minor cycle counter 128 receives the output of OR gate 118 as an input signal, and generates output signals that are coupled to the enable inputs of counters 114 and 124. The central processing unit is also coupled to a data input terminal of the minor cycle counter.

The remainder of the circuitry of the minor period generator 14 provides triggering means for receiving triggering signals from the major period generator 12 and for alternately triggering the first and second timing interval generators 110 and 120. Signal TZ from the major period generator is coupled to input terminals of OR gates 130 and 132. OR gate 130 also receives the output signal from vernier 126 as an input signal. The output terminal of OR gate 130 is connected to the clock input terminal of a D-type flip-flop 134. The non-inverting (Q) output terminal of flip-flop 134 generates a signal which is coupled to oscillator 112 for stopping and restarting clock signal MNACK. The inverting output terminal of flip-flop 134 is connected to one end of a variable delay line 136. The other end of delay line 136 is connected to the input terminal of a buffer 138 and to one end of another delay line 140. The other end of delay line 140 is connected to the set input terminal of flip-flop 134. Buffer 138 generates a signal, MNATZ, that is a minor first time zero signal that designates the beginning of each minor first phase test period. Signal MNATZ is coupled to load input terminals of counter 114 and vernier 116 for initiating the loading of data from the central processing unit. Signal MNATZ is also connected to the signal multiplexer 18 for routing to the timing generators 20.

The second timing interval generator 120 is triggered through OR gate 132. OR gate 132 receives the output signal from vernier 116 and signal TZ as two input signals. The output terminal of OR gate 132 is connected to the clock input terminal of a D-type flip-flop 144. The non-inverting (Q) output terminal of flip-flop 144 generates a signal which is coupled to oscillator 122 for stopping and restarting clock signal MNBCK. The inverting output terminal of flip-flop 144 is connected to one end of a delay line 146. The other end of delay line 146 is connected to the input terminal of a buffer 148 and to one end of another delay line 150. The other end of delay line 150 is connected to the set input terminal of flip-flop 144. Buffer 148 generates a signal, MNBTZ, that is a minor second time zero signal that designates the beginning of each minor second phase test period. Signal MNBTZ is coupled to load input terminals of counter 124 and vernier 126 for initiating the loading of data from the central processing unit. Signal MNBTZ is also connected to the signal multiplexer 18 for routing to the timing generators 20.

A flip-flop 152 enables either the first or the second timing interval generator, 110 or 120, to define the initial minor test period and to thereafter alternate between the two timing interval generators. The non-inverting (Q) output terminal of flip-flop 152 is connected to the D output terminal of flip-flop 134. The inverting output terminal of flip-flop 152 is connected to the D input terminal of flip-flop 144. Signal MNATZ is coupled to the set input terminal of flip-flop 152, while signal MNBTZ is coupled to the reset input terminal of flip-flop 152. When the non-inverting output terminal of flip-flop 152 is at a logic low state, the first timing interval generator 110 is enabled to receive a triggering input signal. Conversely, when the inverting output terminal of flip-flop 152 is at a logic low state, the second timing interval generator 120 is enabled to receive a triggering input signal.

The minor period generator operates basically in the same manner as the major period generator, with a few differences. Since the minor period generator is defining minor test signals within a period of a major test signals, it follows that the periods of the minor test signals are shorter in duration. This is accommodated by loading smaller preselected numbers into counters 114 and 124. Another difference is that the minor cycle counter counts each minor cycle, and disables counters 114 and 124 after a preselected number of minor cycles have occurred. Still another difference is that the variable delay line 136 is included to provide means to precisely balance the fixed delay times of timing interval generators 110 and 120.

The circuitry of the free-run period generator 16 is illustrated in FIG. 5, and is quite similar to that of both the major and minor period generators. The free run period generator includes two interconnected timing interval generators, plus switching and triggering means. A first timing interval generator 160 includes a stop-restart oscillator 162, a counter 164, and a delay-line vernier 166. Oscillator 162 generates a free-run first clock signal, FRACK, which is connected to the clock input terminal of counter 164 and is also connected to the signal multiplexer 18 for routing to the timing generators 20. Vernier 166 has an input terminal connected to an output terminal of counter 164. The central processing unit 28 is coupled to data input terminals of both counter 164 and vernier 166. An output terminal of the sync mode register 38 is connected to an enable input terminal of counter 164.

Similarly, a second timing interval generator 170 includes a stop-restart oscillator 172, a counter 174, and a delay-line vernier 176. Oscillator 172 generates a free-run second clock signal, FRBCK, which is connected to the clock input terminal of counter 174 and is also connected to the signal multiplexer 18 for routing to the timing generators 20. Vernier 176 has an input terminal connected to an output terminal of counter 174. The central processing unit 28 is coupled to data input terminals of both counter 174 and vernier 176. An output terminal of the sync mode register 38 is connected to an enable input terminal of counter 174, and is also connected to an input terminal of an OR gate 178. The components of the first and second timing interval generators 160 and 170 are matched so that both timing interval generators operate in substantially the same fashion.

The remainder of the circuitry of the free-run period generator 16 provides switching and triggering means for receiving triggering signals from the central processing unit 28 to initiate the generation of timing signals and for alternately triggering the first and second timing interval generators 160 and 170. The central processing unit is coupled to an input terminal of an OR gate 179. Another input terminal of OR gate 179 receives a delayed sync signal, DS, from the reference driver trigger delay circuit 27 (see FIG. 7), while an output terminal thereof is connected to input terminals of OR gates 180 and 182. OR gate 180 also receives the output signal from vernier 176 as an input signal. The output terminal of OR gate 180 is connected to the clock input terminal of a D-type flip-flop 184. The non-inverting (Q) output terminal of flip-flop 184 generates a signal which is coupled to oscillator 162 for stopping and restarting clock signal FRACK. The inverting output terminal of flip-flop 184 is connected to one end of a delay line 186. The other end of delay line 186 is connected to the input terminal of a buffer 188 and to one end of another delay line 190. The other end of delay line 190 is connected to the set input terminal of flip-flop 184. Buffer 188 generates a signal, FRATZ, that is a free-run first time zero signal that designates the beginning of each free-run first phase test period. Signal FRATZ is coupled to load input terminals of counter 164 and vernier 166 for initiating the loading of data from the central processing unit. Signal FRATZ is also connected to the signal multiplexer 18 for routing to the timing generators 20.

The second timing interval generator 170 is triggered through OR gate 182. OR gate receives input signals from the central processing unit 28 and vernier 166. The output terminal of OR gate 182 is connected to the clock input terminal of a D-type flip-flop 194. The non-inverting (Q) output terminal of flipflop 194 generates a signal which is coupled to oscillator 172 for stopping and restarting clock signal FRBCK. The inverting output terminal of flip-flop 194 is connected to one end of a delay line 196. The other end of delay line 196 is connected to the input terminal of a buffer 198 and to one end of another delay line 200. The other end of delay line 200 is connected to the set input terminal of flip-flop 194. Buffer 198 generates a signal, FRBTZ, that is a free-run second time zero signal that designates the beginning of each free-run second phase test period. Signal FRBTZ is coupled to load input terminals of counter 174 and vernier 176 for initiating the loading of data from the central processing unit. Signal FRBTZ is also connected to the signal multiplexer 18 for routing to the timing generators 20.

A flip-flop 202 enables either the first or the second timing interval generator, 160 or 170, to define the initial free-run test period and to thereafter alternate between the two timing interval generators when the timing subsystem is in external sync mode. The non-inverting (Q) output terminal of flip-flop 202 is connected to the D input terminal of flip-flop 184. The inverting output terminal of flip-flop 202 is connected to the D input terminal of flip-flop 194. Signal FRATZ is supplied to the set input terminal of flip-flop 202. Signal FRBTZ is supplied to an input terminal of OR gate 178. The output terminal of OR gate 178 is connected to the reset input terminal of flip-flop 202. When the non-inverting output terminal of flip-flop 202 is at a logic low state, the first timing interval generator 160 is enabled to receive a triggering input signal. Conversely, when the inverting output terminal of flip-flop 202 is at a logic low state, the second timing interval generator 170 is enabled to receive a triggering input signal.

The free-run period generator 16 operates independently of the other two period generators. When the timing subsystem is in internal sync mode, the sync mode register 38 enables counters 34 and 44 to enable the major period generator 12, and disables counters 164 and 174 to disable the free-run period generator. In external sync mode, however, the major period generator is disabled and the free-run period generator is enabled. In external sync mode, the free-run period generator generates timing signals that are supplied to the device under test 22, and the major period generator generates one time-zero signal and an aligned clock signal in response to a signal that is fed back from the device under test to the major period generator through the external synchronizer circuit 26.

FIG. 6 illustrates the circuitry of a portion of the signal multiplexer 18 and three timing generators 20. Additional timing generators may be included, but are not shown. The purpose of the signal multiplexer is to selectively connect the time zero and clock signals from the three period generators 12, 14, and 16 to the several timing generators. Each multiplexer 210, 212, and 214 selectively connects one of the three groups of time zero and clock signals to its associated timing generator 216, 218, and 220, respectively. Each multiplexer has twelve input terminals that are coupled to signals ATZ, ACK, BTZ, BCK, MNATZ, MNACK, MNBTZ, MNBCK, FRATZ, FRACK, FRABTZ, and FRBCK. Each multiplexer also has four output terminals that define signals $\phi$ATZ, $\phi$ACK, $\phi$BTZ, and $\phi$BCK. Output signal $\phi$ATZ, for example, is equal to either ATZ, MNATZ, or FRATZ, depending upon the selection by the multiplexer. The selection of each multiplexer is controller by the central processing unit 28.

Each timing generator includes two pairs of counters and delay-line verniers. Counters 22 and vernier 224 form a $\phi$A pair, and counter 226 and vernier 228 form a $\phi$B pair. A clock input terminal of counter 222 is coupled to signal $\phi$ACK, a load input terminal of counter 222 is coupled to signal $\phi$ATZ, a data input terminal of counter 222 is coupled to data bus 230 of the central processing unit 28, and an output terminal of counter 222 is coupled to vernier 124. Vernier 224 has a load input terminal coupled to receive signal $\phi$ATZ, and an output terminal coupled to the pin formatter 24. A clock input terminal of counter 226 is coupled to signal $\phi$BCK, a load input terminal of counter 226 is coupled to signal $\phi$BTZ, a data input terminal of counter 226 is coupled to data bus 230 of the central processing unit 28, and an output terminal of counter 226 is coupled to vernier 228. Vernier 228 has a load input terminal coupled to receive signal $\phi$BTZ, and an output terminal coupled to the pin formatter 24.

Each counter-vernier pair operates to define time intervals in the same way as do the counter-vernier pairs of the period generators. The major difference is that the function generators are slave units that utilize the oscillators of the period generators for clock signals and the associated time zero signals as data load signals. The two counter-vernier pairs within each function generator alternate to define overlapping test periods. The time zero signal that is applied to the counter and vernier of the function generator loads data from the data bus to define a preselected delay. The counter counts clock periods up to a preselected number, and then the delay-line vernier delays the resulting signal by a preselected delay. In essence, the signal multiplexer 18 and timing generators 20 provide broad flexibility in defining timing signals for the device under test.

FIG. 7 illustrates the circuitry of the reference driver trigger delay circuit 27. Two parallel channels 250 and 252 are provided, one for the generation of a rising edge delay signal, RED, and the other for the generation of a falling edge delay signal, FED. The rising edge channel 250 includes a delay counter 254, a high-resolution vernier 256, a delay memory 258, and a delay program step counter 260. Clock signal CK is applied to a clock input terminal of counter 254, while time-zero signal TZ is applied to load input terminals of both counter 254 and vernier 256. An input terminal of vernier 256 is connected to an output terminal of counter 254. An output terminal of vernier 256 generates the rising edge delay signal RED. Delay memory 258 is coupled to both counter 254 and vernier 256 for supplying data to define the duration of the delay through channel 250. The delay memory receives the data from the central processing unit 28. It contains a plurality of entries, with each entry defining a separate delay time. Counter 260 serves as an address pointer to indicate which entry in the delay memory is to be loaded into the counter and vernier. Counter 260 has the capability of incrementing its address pointer by one address upon each timing cycle. A trigger delay mode register 262 is coupled to counter 260 for selecting its mode of operation.

Similarly, the falling edge channel 252 includes a delay counter 264, a high-resolution vernier 266, a delay memory 268, and a delay program step counter 270. Clock signal CK is applied to a clock input terminal of counter 264, while time-zero signal TZ is applied to load input terminals of both counter 264 and vernier 266. An input terminal of vernier 266 is connected to an output terminal of counter 264. An output terminal of vernier 266 generates the falling edge delay signal FED. Delay memory 268 is coupled to both counter 264 and vernier 266 for supplying data to define the duration of the delay through channel 252. The delay memory receives the data from the central processing unit 28. It contains a plurality of entries, with each entry defining a separate delay time. Counter 270 serves as an address pointer to indicate which entry in the delay memory is to be loaded into the counter and vernier. Counter 270 has the capability of incrementing it address pointer by one address upon each timing cycle. The trigger delay mode register 262 is also coupled to counter 270 for selecting its mode of operation.

Counter 254 and vernier 256, and counter 264 and vernier 266 form slave units, similar to those of the timing generators. Verniers 256 and 266 are, however, high-resolution verniers that preferably incorporate linear ramps and comparators to provide a high degree of precision. Each counter and vernier pair is triggered by signal TZ, and each generates an output pulse after a programmed delay subsequent to the receipt of a triggering pulse. Signals RED and FED are supplied to a delayed sync multiplexer 272, which generates a delayed sync signal, DS, equal to either RED or FED.

In general, the reference driver trigger delay circuit provides reference signals for use in system calibration. One operational mode of the reference driver trigger delay circuit is used for calibration of the timing generators 20. In this operational mode, the reference driver trigger delay circuit operates in conjunction with the major period generator and the free-run period generator to calibrate the forcing and comparing timing generators. Both a forcing timing signal and a comparing timing signal are initiated by signals TZ and CK generated by the major period generator. The forcing timing signal is initiated directly by signals TZ and CK, and is routed through the pin formatter 24, to the device under test 22, to the pin electronics comparator 25.

The comparing timing signals is initiated indirectly by signals TZ and CK. The reference driver trigger delay circuit issues the delayed sync signal DS after a programmed delay subsequent to the receipt of a pulse of signal TZ. Signal DS may equal either the rising edge delay signal RED or the falling edge delay signal FED, depending upon the selection of multiplexer 272. Signal DS triggers the free-run period generator to stop and restart oscillator 162 (FIG. 5) to generate free-run clock signal FRACK, and to issue free-rum time-zero signal FRATZ. The sync mode register is set for operation in internal sync mode. This disables the free-run counters 164 and 174, and continually resets flip-flop 202. As a result, signal DS always triggers oscillator 162, not oscillator 172. Signals FRACK and FRATZ then trigger a comparing timing generator to generate the comparing timing signal. This signal is then supplied to the pin electronics comparator for comparison to the forcing timing signal received from the device under test.

One feature of the reference driver trigger delay circuit is particularly advantageous in calibrating the timing generators. Recall that the delay memory contains a plurality of entries, each defining a separate delay time, and that the delay program step counter can address a succession of delay times in a succession of timing cycles. If a series of delay times, each successively slightly longer or shorter in duration, is loaded into the delay memory, then a series of comparing timing signals, each slightly skewed with respect to the forcing timing signal, will be generated over a succession of timing cycles. By bracketing the forcing timing signal, its timing relative to the comparing timing signals can be accurately determined.

The present invention has thus been explained with respect to specific embodiments. Other embodiments will be suggested to one of ordinary skill upon reference to this disclosure. It is therefore not intended that the invention be limited except as indicated by the appended claims.

What is claimed is:

1. A period generator circuit for generating timing signals, said circuit comprising:
a first timing interval generator for defining first phase test periods by supplying a first time zero signal, a first clock for establishing a first testing rate within said first phase test periods and a first transfer signal, said first time zero signal is generated a fixed time after the receipt of a first trigger signal and defines the beginning of each of said first phase test periods, said first timing interval generator including means for resetting said first clock signal in response to said first trigger signal, said first clock signal has a constant frequency and is aligned with respect to the beginning of each of said first phase test periods, said first transfer signal is delayed by a selected amount after the beginning of each of said first phase test periods;
a second timing interval generator for defining second phase test periods by supplying a second time zero signal, a second clock signal for establishing a second testing rate within said second phase test periods, and a second transfer signal, said second time zero signal is generated a fixed time after the receipt of a second trigger signal and defines the beginning of each of said second phase test periods, said second timing interval generator including means for resetting said second clock signal in response to said second trigger signal, said second clock signal is reset by said second trigger signal, has a constant frequency and is aligned with respect to the beginning of each of said second phase test periods, said second transfer signal is delayed by a selected amount after the beginning of each of said second phase test periods; and triggering means coupled to said first and second timing interval generators for alternately generating said first and second trigger signals, said triggering means is operable for generating the initial first trigger signal in response to the receipt of an external start signal, and is operable for thereafter alternately generating said second trigger signal upon the receipt of said first transfer signal and said first trigger signal upon the receipt of said second transfer signal.

2. A circuit as recited in claim 1 wherein said first and second timing interval generators respectively include first and second stop-restart oscillators, each having a stop-restart control port, for generating and aligning said first and second clock signals, respectively; and wherein said triggering means includes means, having first and second output ports coupled to the stop-restart ports of said first and second stop-restart oscillators, respectively, for stopping said first stop-restart oscillator in response to an external start signal or a second transfer signal and restarting said first stop-restart oscillator a fixed time interval after stopping said first stop-restart oscillator and for stopping said second stop-restart oscillator in response to said first transfer signal and restarting said second stop-restart oscillator a fixed time interval after stopping said second stop-restart oscillator.

3. A circuit as recited in claim 2 wherein said first timing interval generator further includes a first counter that is clocked by said first clock signal and a first delay vernier coupled to the output of said first counter for generating said first transfer signal, and wherein said first transfer signal is generated after said first counter counts down to zero from a preselected number and after a preselected delay through said delay vernier;

and wherein said second timing interval generator further includes a second counter that is clocked by said second clock signal and a second delay vernier coupled to the output of said second counter for generating said second transfer signal, and wherein said second transfer signal is generated after said second counter counts down to zero from a preselected number and after a preselected delay through said delay vernier.

4. A circuit as recited in claim 2 wherein said trigger means comprises first and second flip-flops, each having a data input port (D), a clock input port, non-inverting and inverting output ports (Q and $\overline{Q}$), a set port (S) and a reset port (R), and first and second delay elements coupled, respectively, to the inverting terminals $\overline{Q}$, of the first and second flip-flops, said first flip-flop having its non-inverting output terminal, Q, coupled to the stop-restart port of said first oscillator, and having its clock input terminal coupled to receive said second transfer signal, with the signal from said first delay element being said first time zero signal, said second flip-flop having a non-inverting output terminal, Q, coupled to the stop-restart port of said second oscillator, and having a clock input terminal coupled to receive said first transfer signal, with the signal from said second delay element being the second time zero signal.

5. The invention of claim 4 wherein said means for restarting said first oscillator comprises:

a third delay element coupling said first delay element to the set input, S, of said first flip-flop; and wherein said means for restarting said second oscillator comprises:

a fourth delay element coupling said second delay element to the set input, S, of said second flip-flop.

6. The invention of claim 1 further comprising a minor period generator for generating minor timing signals for dividing said first and second phase periods into minor phase periods:

means for forming a TZ signal being the logical sum of said first and second time zero signals;

a first minor timing interval generator for defining first minor phase test periods by supplying a first minor time zero signal, a first clock signal for establishing a first minor testing rate within said first minor phase test periods, and a first minor transfer signal, said first minor time zero signal is generated a fixed time after the receipt of a first minor trigger signal and defines the beginning of each of said first minor phase test periods, said first minor timing interval generator including means for resetting said first minor clock signal in response to said first minor trigger signal, said first minor clock signal has a constant frequency and is aligned with respect to the beginning of each of said first minor phase test periods, said first minor transfer signal is delayed by a selected amount after the beginning of each of said first minor phase test periods;

a second minor timing interval generator for defining second minor phase test periods by supplying a second minor time zero signal, a second minor clock signal for establishing a second minor testing rate within said second minor phase test periods, and a second minor transfer signal, said second minor time zero signal is generated a fixed time after the receipt of a second minor trigger signal and defines the beginning of each of said second minor phase test periods, said second minor timing interval generator including means for resetting said second minor clock signal in response to said second minor trigger signal, said second minor clock signal, has a constant frequency and is aligned with respect to the beginning of each of said second minor phase test periods, said second minor transfer signal is delayed by a selected amount after the beginning of each of said second minor phase test periods; and minor period triggering means coupled to said first and second minor timing interval generators for alternately generating said first and second minor trigger signals, said minor period triggering means is operable for generating the initial first minor trigger signal in response to the receipt of said TZ signal, and is operable for thereafter alternately generating said second minor trigger signal upon the receipt of said first minor transfer signal and said first minor trigger signal upon the receipt of said second minor transfer signal.

7. A timing subsystem for supplying timing signals to a slave timing generator in response to first and second trigger signals, comprising:

a first period generator for generating a first set of timing signals, said first set of timing signals including a first time-zero signal generated in response to said first trigger signal and having edges defining a first test period and also including a first clock signal for establishing a first testing rate within and aligned with said first test period, said first period generator including means for resetting said first clock signal in response to said first trigger signal, said first clock signal being reset by said first trigger signal to commence a first predetermined amount of time after a beginning of said first test period;

a second period generator for generating a second set of timing signals, said second set of timing signals including a second time-zero signal generated in response to said second trigger signal and having edges defining a second test period and also including a second clock signal for establishing a second testing rate, said second period generator including means for resetting said second clock signal in response to said second trigger signal, said second clock signal being reset by said second trigger signal to commence a second predetermined amount of time after a beginning of said second test period; and signal selection means coupled to said first and second period generators for supplying selected ones of said first and second sets of timing signals to said slave generator.

8. The timing subsystem of claim 7 wherein said first and second time-zero signals are variable to vary said first and second test periods.

9. The timing subsystem of claim 7 wherein said first and second period generators are major and minor period generators, respectively, said minor period generator generating said second clock signal with a period within a period of said first clock signal, said second period generator is coupled to be triggered by said first time-zero signal of said first period generator, said second test period is within said first test period, and said second test period commences a third predetermined amount of time after said beginning of said first test period.

10. The timing subsystem of claim 9 further comprising a free-run period generator for generating a third set of timing signals, said third set of timing signals including a first free-run time-zero signal having edges defining a free-run test period, and also including a free-run clock signal, said free-run clock signal commencing a third predetermined amount of time after a beginning of said free-run test period, said first free-run time-zero signal being variable to vary said free-run test period, said free-run period generator being coupled to said signal selection means, wherein said signal selection means supplies selected ones of said first, second and third sets of timing signals to said slave generator.

11. The timing subsystem of claim 10 wherein said third set of timing signals further includes a second free-run time-zero signal and second-free run clock signal, said free-run period generator including a first free-run timing interval generator for producing said first free-run time-zero and clock signals and a first free-run transfer signal, and a second free-run timing interval generator for producing said second free-run time-zero and clock signals and a second free-run transfer signal, said second free-run timing interval generator being triggered by said first free-run transfer signal to produce said second free-run time-zero and clock signals, and said first free-run timing interval generator being triggered by said second free-run transfer signal to produce said first free-run time-zero and clock signals.

12. The timing subsystem of claim 7 wherein said first and second period generators are major and free-run period generator, respectively, and further comprising programmable delay means, coupled to receive said first time-zero and clock signals for generating a delayed sync signal after a programmable delay subsequent to the receipt of said first time-zero signal, said second period generator being coupled to said programmable delay means for generating said second time-zero signal a fixed delay after receipt of said delayed sync signal.

13. The timing subsystem of claim 12 wherein said slave timing generator includes first and second timing generators for generating first and second test timing signals after first and second delays subsequent to the receipt of said first and second time-zero signals, respectively, and wherein the difference between said first delay and the sum of said programmable delay, said fixed delay and said second delay is a measure of calibration error for said first and second timing generators.

14. The timing subsystem of claim 7 wherein said first set of timing signals further includes a third time-zero signal and third clock signal, said first period generator including a first timing interval generator for producing said first time-zero and clock signals and a first transfer signal and a third timing interval generator for producing said third time-zero and clock signals and a third transfer signal, said third timing interval generator being triggered by said first transfer signal to produce said third time-zero and clock signals and said first timing interval generator being triggered by said third transfer signal to produce said first time-zero and clock signals.

15. The timing subsystem of claim 14 wherein said second set of timing signals further includes a fourth time-zero signal and fourth clock signal, said second period generator including a second timing interval generator for producing said second time-zero and clock signals and a second transfer signal and a fourth timing interval generator for producing said fourth time-zero and clock signals and a fourth transfer signal, said fourth timing interval generator being triggered by said second transfer signal to produce said fourth time-zero and clock signals, and said second timing interval generator being triggered by said fourth transfer signal to produce said second time-zero and clock signals.

16. The timing subsystem of claim 14 wherein each of said timing interval generators comprises a flip-flop having an input coupled to receive one of said transfer signals, a stop-restart oscillator having an input coupled to a first output of said flip-flop, a counter having an input coupled to an output of said stop-restart oscillator and a delay vernier having an input coupled to an output of said counter, and output of said delay vernier producing one of said transfer signals, said output of said stop-restart oscillator producing one of said clock signals, and a second output of said flip-flop producing one of said time-zero signals.

17. The timing subsystem of claim 16 wherein said counter and said delay vernier have data inputs for setting a count and a delay, respectively, and further comprising a central processing unit and a data bus coupling said central processing unit to said data inputs of said counter and delay vernier.

18. The timing subsystem of claim 7 wherein said signal selection means comprises a multiplexer.

19. The timing subsystem of claim 7 further comprising an external synchronizing and delay circuit for providing said first trigger signal to said first period generator after a selected delay from receipt of an external trigger signal.

20. A timing subsystem for supplying timing signals to a slave timing generator, comprising:
- a major period generator for generating a first set of timing signals, said first set of timing signals including a major time-zero signal having edges defining a major test period and also including a first clock signal, said first clock signal commencing a first predetermined amount of time after a beginning of said major test period, said major time-zero signal being variable to vary said major test period;
- a minor period generator coupled to said major period generator for generating a second set of timing signals, said second set of timing signals including a minor time-zero signal having edges defining a minor test period and also including a second clock signal, said second clock signal commencing a second predetermined amount of time after a beginning of said minor test period, said minor test period being within said major test period, said minor time-zero signal being variable to vary said minor test period;
- a free-run period generator for generating a third set of timing signals, said third set of timing signals including a free-run time-zero signal having edges defining a free-run test period, and also including a free-run clock signal, said free-run clock signal commencing a third predetermined amount of time after a beginning of said free-run test period, said free-run time-zero signal being variable to vary said free-run test period;
- signal selection means coupled to said major, minor and free-run period generators for supplying selected ones of said first, second and third sets of timing signals to said slave generator; and
- a central processing unit coupled to said major, minor and free-run period generators and said signal selection means for controlling a length of said major, minor and free run test periods and the selection of said selected ones of said first, second and third sets of timing signals.

21. The circuit as recited in claim 3 further comprising a central processing unit and a data bus coupling said central processing unit to data inputs of said counters and said delay verniers.

22. A timing device for calibrating first and second timing generators, said timing generators respectively operable for receiving first and second time-zero and clock signals and for generating first and second timing signals after first and second delays subsequent to the receipt of said first and second time-zero signals, said timing device comprising:
- first means for generating a first time-zero signal and a first clock signal;
- programmable delay means, coupled to receive said first time-zero and clock signals, for generating a delayed sync signal after a programmable delay subsequent to the receipt of said first time-zero signal;
- second means for generating a second time-zero signal and a second clock signal a fixed delay after the receipt of said delayed sync signal, wherein the difference between said first delay and the sum of said programmable delay, said fixed delay, and said second delay is a measure of calibration error; and
- means, responsive to said calibration error, for varying at least one of said delay, said second delay and said programmable delay.

23. A timing device as recited in claim 22 wherein said programmable delay means comprises a counter disposed to receive said first clock signal, a vernier coupled to said counter and operable for supplying said delayed sync signal, a delay memory having an output coupled to said counter and said vernier, said delay memory containing a plurality of data entries, each data entry specifying a programmable delay, and memory addressing means coupled to an address input of said delay memory for selecting a programmable delay by providing an address of a desired one of said plurality of entries.

24. A timing device as recited in claim 23 wherein said memory addressing means comprises a counter operable to provide addresses of successive entries at successive cycles of said timing device.

25. A timing device as recited in claim 22 wherein said first means includes a stop-restart oscillator for aligning said first clock signal with respect to said first time-zero signal.

26. A timing device as recited in claim 22 wherein said second means includes a stop-restart oscillator for aligning said second clock signal with respect to said second time-zero signal.

* * * * *